United States Patent
Ahn et al.

(10) Patent No.: US 11,335,836 B2
(45) Date of Patent: May 17, 2022

(54) MICRO LED STRUCTURE AND METHOD OF MANUFACTURING SAME

(71) Applicant: POINT ENGINEERING CO., LTD., Asan (KR)

(72) Inventors: Bum Mo Ahn, Suwon (KR); Seung Ho Park, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 21 days.

(21) Appl. No.: 16/563,529

(22) Filed: Sep. 6, 2019

(65) Prior Publication Data
US 2020/0083412 A1    Mar. 12, 2020

(30) Foreign Application Priority Data
Sep. 6, 2018    (KR) .......................... 10-2018-0106497

(51) Int. Cl.
*H01L 33/50*    (2010.01)
*H01L 33/00*    (2010.01)

(52) U.S. Cl.
CPC ........ *H01L 33/505* (2013.01); *H01L 33/0095* (2013.01); *H01L 33/504* (2013.01); *H01L 2933/0041* (2013.01)

(58) Field of Classification Search
None
See application file for complete search history.

(56) References Cited

U.S. PATENT DOCUMENTS 9,391,051 B2 *    7/2016    Rhee ....................... H01L 33/62
2018/0012949 A1    1/2018    Takeya et al.

FOREIGN PATENT DOCUMENTS

| CN | 107422529 A | * | 12/2017 |
| CN | 109817686 A | * | 5/2019 |
| KR | 20180031126 A | | 3/2018 |

* cited by examiner

*Primary Examiner* — Robert K Carpenter (57) ABSTRACT

The present invention relates to a micro LED structure and a method of manufacturing the same that facilitate realizing of pixels of the micro LED structure.

7 Claims, 7 Drawing Sheets

MICRO LED STRUCTURE AND METHOD OF MANUFACTURING SAME

CROSS REFERENCE TO RELATED APPLICATION

The present application claims priority to Korean Patent Application No. 10-2018-0106497, filed Sep. 6, 2018, the entire content of which is incorporated herein for all purposes by this reference.

BACKGROUND OF THE INVENTION

Field of the Invention

The present invention relates to a micro LED structure and a method of manufacturing the same.

Description of the Related Art

Currently, the display market is still dominated by LCDs, but OLEDs are quickly replacing LCDs and emerging as mainstream products. In a current situation where display makers are rushing to participate in the OLED market, micro light-emitting diode (hereinafter, referred to as micro LED) displays have emerged as another next-generation display. The micro LED is not a package type covered with molded resin or the like but a piece obtained by cutting out a wafer used for crystal growth. Liquid crystal and organic materials are the core materials of LCDs and OLEDs, respectively, whereas the micro LED display uses 1 μm to 100 μm of LED chips as a light emitting material.

It is difficult to implement emission of red, green, and blue light on one substrate using micro LEDs, pixel geometry may be realized using phosphor layers. Realizing of pixel geometry using such phosphor layers is disclosed in U.S. Patent Application Publication No. 2018-0012949 (hereinafter referred to as 'Patent Document 1').

A display apparatus in Patent Document 1 includes: a light conversion part including a phosphor layer, a color filter, and a protective substrate; light emitting diodes; and the like. The phosphor layer disposed above the light emitting diodes and disposed on the protective substrate converts wavelength of light emitted from the light emitting diodes and transmits different colors of light.

However, in Patent Document 1, the phosphor layer is required to be formed in advance so that light emitted from each of the light emitting diodes can be converted into light having a specific wavelength and transmitted therethrough. In addition, in a case of forming the phosphor layer on top of each of the light emitting diodes, it is difficult to prepare and provide the phosphor layer in advance because it is necessary to determine a desired wavelength of light to be obtained by converting the light emitted from the light emitting diodes in advance.

In addition, it is troublesome to perform an additional process such as imprinting, roll lamination, or ink jetting in order to provide the phosphor layer on the light emitting diodes. Each means for performing the additional process is required to be provided, which makes the entire process complicated and reduces the efficiency of the entire process.

Documents of Related Art (Patent Document 1) U. S. Patent Application Publication No. 2018-0012949

SUMMARY OF THE INVENTION

Accordingly, the present invention has been made keeping in mind the above problems occurring in the related art, and an objective of the present invention is to provide a micro LED structure and a method of manufacturing the same, the micro LED structure being configured such that pixel geometry is easily realized using color conversion films transmitting light having a wavelength different from light absorbed from micro LEDs.

In order to achieve the above objective, there is provided a micro LED structure including: multiple micro LEDs transferred to a second substrate; and a color conversion film transferred onto the micro LEDs.

The color conversion film may be transferred in a strip shape.

The color conversion film may be transferred in a lattice form.

The micro LED structure may further include: a transparent film transferred onto the micro LEDs.

The micro LEDs may be blue micro LEDs, and the color conversion film may include a first color conversion film converting blue light into red light and a second color conversion film converting blue light into green light.

In order to achieve another objective, there is provided a micro LED structure including: multiple micro LEDs transferred to a second substrate; a first color conversion film transferred at a pitch distance in a transverse direction three times a pitch distance in a transverse direction of the micro LEDs in a manner extending in a longitudinal direction of the micro LEDs; and a second color conversion film transferred at a pitch distance in the transverse direction three times a pitch distance in the transverse direction of the micro LEDs in a manner extending in the longitudinal direction of the micro LEDs in a strip shape while being spaced apart from the first color conversion film in the transverse direction.

The micro LED structure may further include: a transparent film transferred between the first and second color conversion films.

The micro LEDs may be flip-chip micro LEDs

In order to achieve still another objective, there is provided a method of manufacturing a micro LED structure, the method comprising: a first step in which a first transfer head grips and transfers micro LEDs fabricated on a first substrate to a second substrate; and a second step in which a second transfer head transfers a strip-shaped color conversion film onto the micro LEDs transferred to the second substrate to realize pixels on the second substrate.

The strip-shaped color conversion film may be transferred at a pitch distance in at least one direction three times in the one or more directions of the micro LEDs transferred to the second substrate.

At the second step, the color conversion film formed by being cut into a lattice form may be transferred onto the micro LEDs transferred to the second substrate to realize pixels on the second substrate.

The second step may be performed using the first transfer head.

The color conversion film formed by being cut into the lattice form may be transferred according to an arrangement of grip portions of the first transfer head.

As described above, a micro LED structure and a method of manufacturing the same according to the present invention have effects in that since the micro LED structure is configured such that pixel geometry is easily realized using the color conversion film transmitting light having a wavelength different from light absorbed from the micro LEDs.

In addition, transferring of the color conversion films can be simply performed without an additional process, and the process can be performed by one transfer means according to a shape of the color conversion film, thereby improving the efficiency of the process.

Furthermore, according to the present invention, transferring of the color conversion film onto the micro LEDs at a time for forming pixels can be effectively performed.

BRIEF DESCRIPTION OF THE DRAWINGS

The above and other objects, features and other advantages of the present invention will be more clearly understood from the following detailed description when taken in conjunction with the accompanying drawings, in which:

FIG. 4 to FIG. 7B are views each schematically illustrating a method of manufacturing the embodiments of the present invention.

DETAILED DESCRIPTION OF THE INVENTION

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention are described with reference to cross-sectional views and/or perspective views which schematically illustrate ideal embodiments of the present invention. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of multiple micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, embodiments of the present invention will be described in detail with reference to the accompanying drawings.

Figure 1:
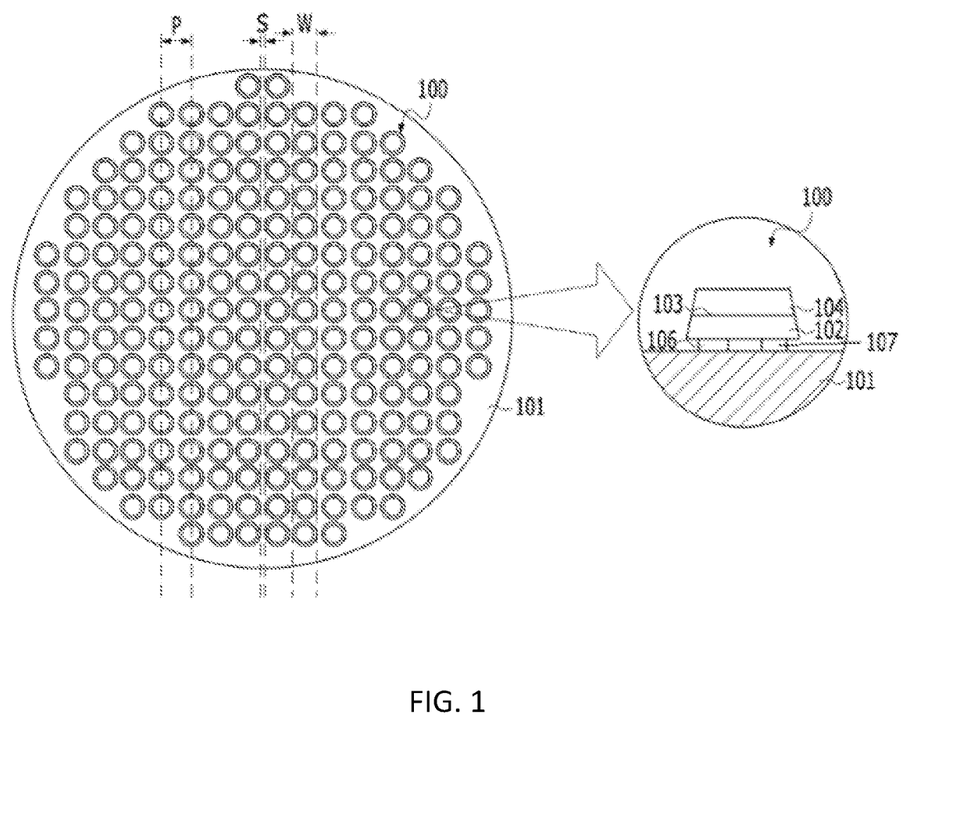
FIG. 1 is a view illustrating micro LEDs according to the present invention.

FIG. 1 is a view illustrating micro LEDs 100 according to the embodiment of the present invention which constitute a micro LED display device. The micro LEDs 100 are fabricated and disposed on a growth substrate 101.

The micro LEDs 100 emit light having wavelengths of different colors such as red, green, blue, white, and the like. With the micro LEDs 100, it is possible to realize white light by using fluorescent materials or by combining colors. Each of the micro LEDs 100 has a size of 1 μm to 100 μm.

The growth substrate 101 may be embodied by a conductive substrate or an insulating substrate. For example, the growth substrate 101 is made of at least one selected from among the group consisting of sapphire($Al_2O_3$), SiC, Si, GaAs, GaN, ZnO, GaP, InP, Ge, and $Ga_2O_3$.

Each of the micro LEDs 100 includes: a first semiconductor layer 102; a second semiconductor layer 104; an active layer 103 provided between the first semiconductor layer 102 and the second semiconductor layer 104; a first contact electrode 106; and a second contact electrode 107. The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HYPE), or the like.

The first semiconductor layer 102 may be implemented, for example, as a p-type semiconductor layer. A p-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, and the like, and the layer may be doped with a p-type dopant such as Mg, Zn, Ca, Sr, and Ba. The second semiconductor layer 104 may be implemented, for example, as an n-type semiconductor layer. An n-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InNInAlGaN, AlInN, and the like, and the layer may be doped with an n-type dopant such as Si, Ge, and Sn.

However, the present invention is not limited to this. The first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first contact electrode 106 and the second contact electrode 107 may be provided on the first semiconductor layer 102. The first contact electrode 106 and/or the second contact electrode 107 may be formed of various conductive materials including a metal, conductive oxide, and conductive polymer.

In FIG. 1, the letter 'P' denotes a pitch distance between the micro LEDs 100, 'S' denotes a separation distance between the micro LEDs 100, and 'W' denotes a width of each micro LED 100. Although FIG. 1 illustrates that each cross section of the micro LEDs 100 is circular, a cross section of the micro LEDs is not limited thereto. The micro LEDs 100 may have another cross section shape other than the circular cross section, according to a method of fabricating the micro LEDs 100 on the growth substrate 101. For example, the micro LEDs 100 may have a quadrangular cross section. In the following drawings, the cross section of the micro LEDs 100 is quadrangular for the sake of convenience.

Figure 2:
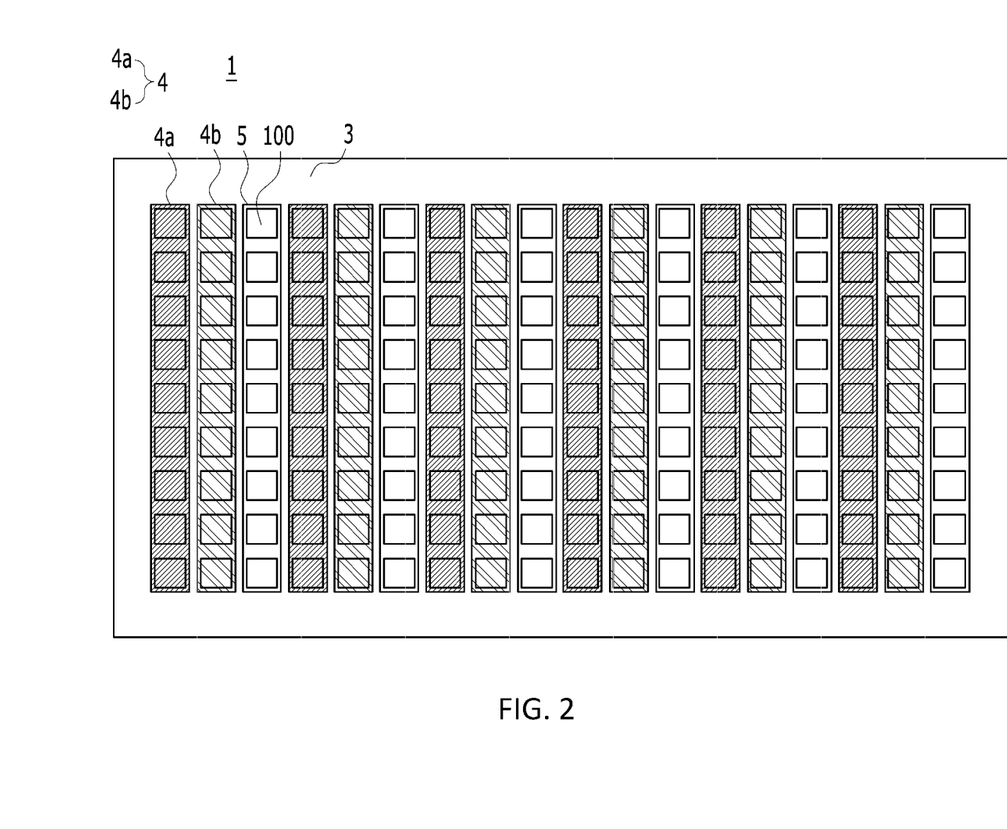
FIG. 2 is a view illustrating a micro LED structure according to a first embodiment of the present invention.

FIG. 2 is a top view illustrating a micro LED structure 1 according to a first embodiment of the present invention. As illustrated in FIG. 2, the micro LED structure 1 according to the present invention includes: the multiple micro LEDs 100 transferred to a second substrate 3; and color conversion films 4 transferred onto the micro LEDs 100.

As illustrated in FIG. 2, the micro LEDs 100 are transferred to the second substrate 3. The second substrate 3 here to which the micro LEDs 100 are transferred may be a circuit board, a temporary substrate, or a carrier substrate. In a case where the second substrate 3 is a circuit board, the color conversion films 4 are transferred onto the micro LEDs 100 transferred to the circuit board, and thus pixel geometry is realized and the micro LED structure 1 is configured. The micro LED structure 1 may be provided in a device capable of outputting an image. In a case where the second substrate 3 is a temporary substrate or a carrier substrate, color conversion films are transferred onto the micro LEDs 100 transferred to the temporary substrate or the carrier substrate, and thus pixel geometry is realized and the micro LED structure 1 is configured. The micro LED structure 1 may be in a state before being provided in an image output device or another device. The micro LEDs 100 transferred to the second substrate 3 are preferably flip-chip micro LEDs. The micro LED structure 1 is configured such that the color conversion films 4 are transferred onto the micro LEDs 100 transferred to the second substrate 3. Therefore, it is preferable to transfer the flip-chip micro LEDs 100 in which terminals are positioned lower portions of the micro LEDs 100 to the second substrate 3. The micro LEDs to be transferred to the second substrate 3 emit light of red, green, blue, and white colors. In the present invention, the micro LEDs 100 to be transferred to the second substrate 3 will be described as blue micro LEDs 100 emitting blue light as an example.

The color conversion films 4 are transferred onto the micro LEDs 100 transferred to the second substrate 3. The color conversion films 4 are transferred onto the micro LEDs 100 to absorb light of the micro LEDs 100 and transmit light having a wavelength different from that of the absorbed light. For example, in a case of the blue micro LEDs 100, the color conversion films 4 are transferred onto the micro LEDs 100 and convert blue light into red light or green light. In the following description, the color conversion films 4 converting blue light into red light are referred to as first color conversion films 4a, and the color conversion films 4 converting blue light into green light are referred to as second color conversion films 4b for the sake of ease of explanation.

As illustrated in FIG. 2, the color conversion films 4 may be transferred in a strip shape onto the micro LEDs 100 transferred to the second substrate 3. In this case, the micro LED structure 1 may further include transparent films 5. The transparent films 5 may be transferred in the strip shape onto the micro LEDs 100 as are the color conversion films 4. Here, the transparent films 5 transmits specific light emitted from the micro LEDs 100 without changing wavelength. Since the transparent films 5 transmit light of the micro LEDs 100 as it is, the transparent films 5 may be selectively provided. In a case where the transparent films 5 are provided in the micro LED structure 1, the transparent films 5 are provided in the same form as the color conversion films 4 and transferred onto the micro LEDs 100. In the following description, the transparent films 5 are transferred in the micro LED structure 1.

In the case where the color conversion films 4 are transferred onto the micro LEDs 100 in the strip shape, the color conversion films 4 may be transferred at a regular pitch distance in at least one of longitudinal and transverse directions and transferred onto the micro LEDs 100 disposed in at least one of the longitudinal and transverse directions among the micro LEDs 100 transferred to the second substrate 3. In this case, a direction of the pitch distance may be different from a direction in which the color conversion films 4 are transferred. For example, in a case where the color conversion films 4 are transferred in the longitudinal direction of the micro LEDs 100 transferred to the second substrate 3, the color conversion films 4 may be transferred at a regular pitch distance in the transverse direction of the micro LEDs 100. As an embodiment of the present invention, as illustrated in FIG. 2, in the following description, the first and second color conversion films 4a and 4b of the color conversion films 4 are transferred in a manner extending in the longitudinal direction of the micro LEDs 100 in the strip shape.

As illustrated in FIG. 2, according to the first embodiment, the first color conversion films 4a are transferred onto the micro LEDs 100 transferred to the second substrate 3. In the following description, the first color conversion films 4a are transferred onto the micro LEDs 100 at a regular pitch distance in the transverse direction with respect to the micro LEDs 100 transferred to the leftmost column of the second substrate 3 (hereinafter referred to as 'first column) with respect to the longitudinal direction of the micro LEDs 100. However, this is merely an example, and the color conversion films 4 transferred onto the micro LEDs 100 at a regular pitch distance in the transverse direction, starting from on the first column of the second substrate 3, may be the second color conversion films 4b or the transparent films 5. Therefore, it is possible that an arrangement of the first and second color conversion films 4a and 4b and the transparent films 5 of the micro LED structure 1 is different from the embodiment of the present invention. However, in order to realize pixel geometry, the first color conversion films 4a transmitting red light, the second color conversion films 4b transmitting green light, and the transparent films 5 transmitting natural blue light of the micro LEDs 100 are required to constitute pixels. Therefore, the first and second color conversion films 4a and 4b and the transparent films 5 may be transferred in an arrangement capable of constituting pixels which is different from the arrangement of the embodiment of the present invention.

As illustrated in FIG. 2, the first color conversion films 4a may be transferred at a pitch distance in the transverse direction three times the pitch distance in the transverse direction of the micro LEDs 100 transferred to the second substrate 3 in a manner extending in the longitudinal direction of the micro LEDs 100 in the strip shape. Since the first color conversion films 4a are transferred onto the micro LEDs 100 in the strip shape in a manner extending in the longitudinal direction of the micro LEDs 100, when described with reference to the first column of the second substrate 3 in the drawing, one of the first color conversion films 4a corresponding to the micro LEDs 100 on the first column has an extended form in which the corresponding first color conversion film 4a is transferred onto the micro LEDs 100 transferred to the first column of the second substrate 3. In this case, the first color conversion films 4a are transferred at a pitch distance in the transverse direction three times the pitch distance in the transverse direction of the micro LEDs 100 of the second substrate 3 in a manner extending in the longitudinal direction of the micro LEDs 100 in the strip shape. Thus, as the first color conversion film 4a on the first column of the second substrate 3 has, the first color conversion films 4a may also have the extended form in which the first color conversion films 4a are transferred onto the micro LEDs 100 transferred to the fourth, seventh, tenth, thirteenth, and sixteenth columns of the second substrate 3. In other words, the first color conversion films 4a may have the extended form in which the first color conversion films 4a are transferred to the micro LEDs 100 that have the regular distance in the transverse direction of the micro LEDs 100 of the second substrate 3.

The first color conversion films 4a absorb blue light of the micro LEDs 100 and convert the blue light into red light. Since light emitted from the micro LEDs 100 on which the first color conversion films 4a are transferred is converted into red light by the first color conversion films 4a, red light can be emitted.

While being spaced apart from the first color conversion films 4a in the transverse direction, the second color conversion films 4b may be transferred onto the micro LEDs 100 at a pitch distance in the transverse direction three times the pitch distance in the transverse direction of the micro LEDs 100 transferred to the second substrate 3 in a manner extending in the longitudinal direction of the micro LEDs 100. The second color conversion films 4b are transferred in the strip shape as the first color conversion films 4a are while spaced apart from the first color conversion films 4a in the transverse direction. Thus, one of the second color conversion films 4b corresponding to the second column which is next to the first column of the second substrate 3 illustrated in the drawing may have the extended form in which the corresponding second color conversion film 4b is transferred onto the micro LEDs 100 of the second column.

The second color conversion films 4b spaced apart from the first color conversion films 4a in the transverse direction are transferred onto the micro LEDs 100, starting from the second column of the second substrate 3, at a pitch distance in the transverse direction three times the pitch distance in the transverse direction of the micro LEDs 100 of the second substrate 3 in a manner extending in the longitudinal direction of the micro LEDs 100.

The second color conversion films 4b absorb blue light of the micro LEDs 100 and convert the blue light into green light. Since light emitted from the micro LEDs 100 on which the second color conversion films 4b are transferred is converted into green light, green light is emitted.

Color filters (not illustrated) may be provided on the color conversion films 4 transferred onto the micro LEDs 100 transferred to the second substrate 3, wherein the color filters block light transmitted the color conversion films 4 except light of a specific wavelength. For example, in a case where the color filters are provided on the first color conversion films 4a converting blue light into red light, the color filters block light except red light so that only red light is emitted. In addition, in a case where the color filters are provided on the second color conversion films 4b converting blue light into green light, the color filters block light except green light so that only green light is emitted. The transparent films 5 may be transferred onto the micro LEDs 100 transferred to the second substrate 3. The transparent films 5 may be transferred between the first and second color conversion films 4a and 4b. The transparent films are transferred between the first and second color conversion films 4a and 4b at a pitch distance in the transverse direction three times the pitch distance in the transverse direction of the micro LEDs 100 transferred to the second substrate 3 in a manner extending in the longitudinal direction of the micro LEDs 100 in the strip shape, as do the first and second color conversion films 4a and 4b. In addition, as illustrated in FIG. 2, one of the transparent films 5 is transferred in an extended form onto the micro LEDs 100 of the third column next to the second column while being spaced apart from the second color conversion films 4b transferred onto the micro LEDs 100 of the second column of the second substrate 3. The transparent films 5 are transferred onto the micro LEDs 100 at a pitch distance in the transverse direction three times the pitch distance in the transverse direction of the micro LEDs 100 of the second substrate 3, starting from the third column of the second substrate.

The transparent films 5 absorb blue light of the micro LEDs 100 and transmit natural blue light emitted from the micro LEDs 100.

The color filters may be provided on the transparent films 5. However, the color filters provided on the transparent films 5 may not be a filter blocking light except light of a specific wavelength but may be a single transparent layer transmitting natural blue light emitted from the micro LEDs 100 and transmitted the transparent films 5. As the transparent films 5 transmitting natural light emitted from the micro LEDs 100 are selectively provided, the color filters may be selectively provided on the transparent films 5.

When the color filters are provided on the color conversion films 4, it is possible to improve the color purity of light of a specific wavelength which is obtained by the conversion by the color conversion films 4. When no color filters are provided, the thickness of the color conversion films 4 may be appropriately adjusted so that only light of a specific wavelength to be emitted is emitted.

As illustrated in FIG. 2, the first color conversion films 4a are transferred onto the micro LEDs 100 at a pitch distance in the transverse direction three times the pitch distance in the transverse direction of the micro LEDs 100 of the second substrate 3, starting from the first column of the second substrate 3. While being spaced apart from the first color conversion films 4a in the transverse direction, the second color conversion films 4b are transferred onto the micro LEDs 100 at a pitch distance in the transverse direction three times the pitch distance in the transverse direction of the micro LEDs 100 of the second substrate 3, starting from the second column of the second substrate 3. While being spaced apart from the second color conversion films 4b in the transverse direction, the transparent films 5 are transferred onto the micro LEDs 100 at a pitch distance in the transverse direction three times the pitch distance in the transverse direction of the micro LEDs 100 of the second substrate 3, starting from the third column of the second substrate 3. Accordingly, the first and second color conversion films 4a and 4b and the transparent films 5 are arranged on the micro LEDs 100 in order with respect to the first column of the second substrate 3. In other words, the first and second color conversion films 4a and 4b and the transparent films 5 are disposed in order on the micro LEDs 100 of the first to third columns of the second substrate 3. The color conversion films 4 and the transparent films 5 transferred onto the micro LEDs 100 of the first to third columns may constitute pixels. The pixels enable pixel geometry to be realized.

The first and second color conversion films 4a and 4b are transferred at a pitch distance in the transverse direction three times the pitch distance in the transverse direction of the micro LEDs 100 of the second substrate 3 in a manner extending in the longitudinal direction of the micro LEDs 100 in the strip shape, and the transparent films 5 are transferred between the first and second color conversion films 4a and 4b in the strip shape. Thus, multiple pixels constituted by the color conversion films 4 and the transparent films 5 are formed on the micro LEDs 100 of the second substrate 3.

According to the first embodiment, the color conversion films 4 are transferred onto the micro LEDs 100 transferred to the second substrate 3, thereby easily realizing pixel geometry. In a case where pixel geometry is realized using a phosphor layer, the phosphor layer is required to be formed in advance. In addition, in a case of forming the phosphor layer on top of each of the micro LEDs, it is difficult to prepare the phosphor layer in advance because it is necessary to determine a desired wavelength of light to be obtained by converting the light emitted from the micro LEDs in advance. However, according to the present invention, the films converting light emitted from the micro LEDs 100 into light of a specific wavelength to change light color are transferred onto the micro LEDs 100 transferred to the second substrate 3, thereby easily realizing pixel geometry. Therefore, there is no need to form a light converting means in advance, such as the phosphor layer.

Figure 3:
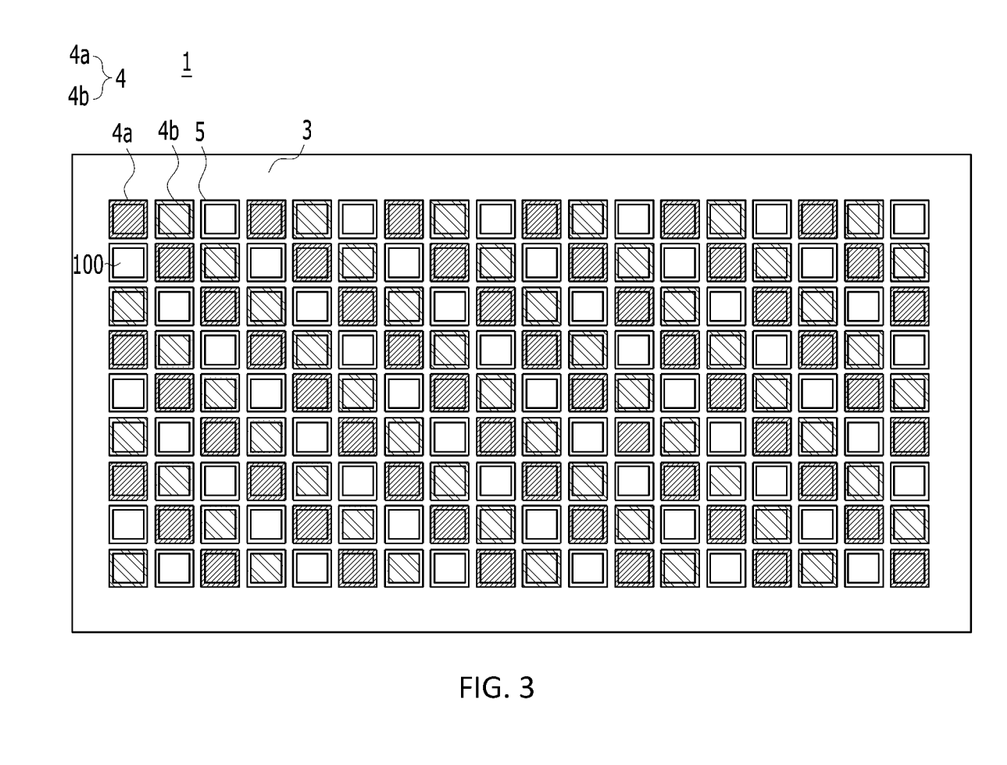
FIG. 3 is a view illustrating a micro LED structure according to a second embodiment of the present invention.

FIG. 3 is a view illustrating a micro LED structure 1 according to a second embodiment of the present invention. The micro LED structure 1 according to the second embodiment is different in that the color conversion films 4 of the micro LED structure 1 according to the first embodiment are cut and provided to be transferred in a lattice form onto the micro LEDs 100 transferred to the second substrate 3.

As illustrated in FIG. 3, color conversion films 4 may be transferred in a lattice form onto the micro LEDs 100 transferred to the second substrate 3. In order to transfer the color conversion films 4 in the lattice form onto the micro LEDs 100, the color conversion films 4 may be configured such that the horizontal width thereof is equal to that of the micro LEDs 100 or greater than that of the micro LEDs 100, and a cross section thereof is the same as that of the micro LEDs 100. For example, when the micro LEDs 100 have a quadrangular cross section, the color conversion films 4 may have a quadrangular cross section to be provided on the micro LEDs 100. However, when the horizontal width of the color conversion films 4 is greater than that of the micro LEDs 100, the color conversion films 4 may have a different shape of a cross section from the micro LEDs 100. In the following description, the color conversion films 4 have a quadrangular cross section and a horizontal width greater than that of the micro LEDs 100 for the sake of easy explanation. Transparent films 5 may be selectively provided. In this case, the transparent films 5 are provided in the same form as the color conversion films 4 and transferred in a lattice form onto the micro LEDs 100.

As illustrated in FIG. 3, the color conversion films 4 are transferred in a lattice form onto the micro LEDs 100 transferred to the second substrate 3. The transparent films 5 may be transferred in the lattice form. The color conversion films 4 may be transferred onto the micro LEDs 100 at regular pitch distances in the longitudinal and transverse directions of the micro LEDs 100 transferred to the second substrate 3. The transparent films 5 may also be transferred onto the micro LEDs 100 at regular pitch distances in the longitudinal and transverse directions of the micro LEDs 100 transferred to the second substrate 3. The color conversion films 4 may be transferred onto the micro LEDs 100 at a regular pitch distance in a diagonal direction of the micro LEDs 100 transferred to the second substrate 3. The transparent films 5 may also be transferred onto the micro LEDs 100 at a regular pitch distance in the diagonal direction of the micro LEDs 100 transferred to the second substrate 3.

As described above, when the color conversion films 4 and the transparent films 5 are transferred at regular pitch distances in the longitudinal and transverse directions or in the diagonal direction of the micro LEDs 100 transferred to the second substrate 3 onto the corresponding micro LEDs 100, the color conversion films 4 and the transparent films 5 are transferred in a lattice form.

The micro LED structure 1 according to the second embodiment is configured such that the first and second color conversion films 4a and 4b and the transparent films 5 are transferred onto the corresponding micro LEDs 100 transferred in a lattice form to the second substrate 3. Thus, each one of the first and second color conversion films 4a and 4b and one of the transparent films 5 may constitute one pixel with a 1×3 arrangement.

As described in the embodiments, according to the present invention, the color conversion films 4 converting color of light emitted from the micro LEDs 100 are transferred onto the micro LEDs 100, thereby easily realizing pixel geometry, compared with a case in which an additional means for converting light emitted from the micro LEDs 100 into light of a different wavelength is required to be formed in advance to realize pixel geometry.

Figure 4:
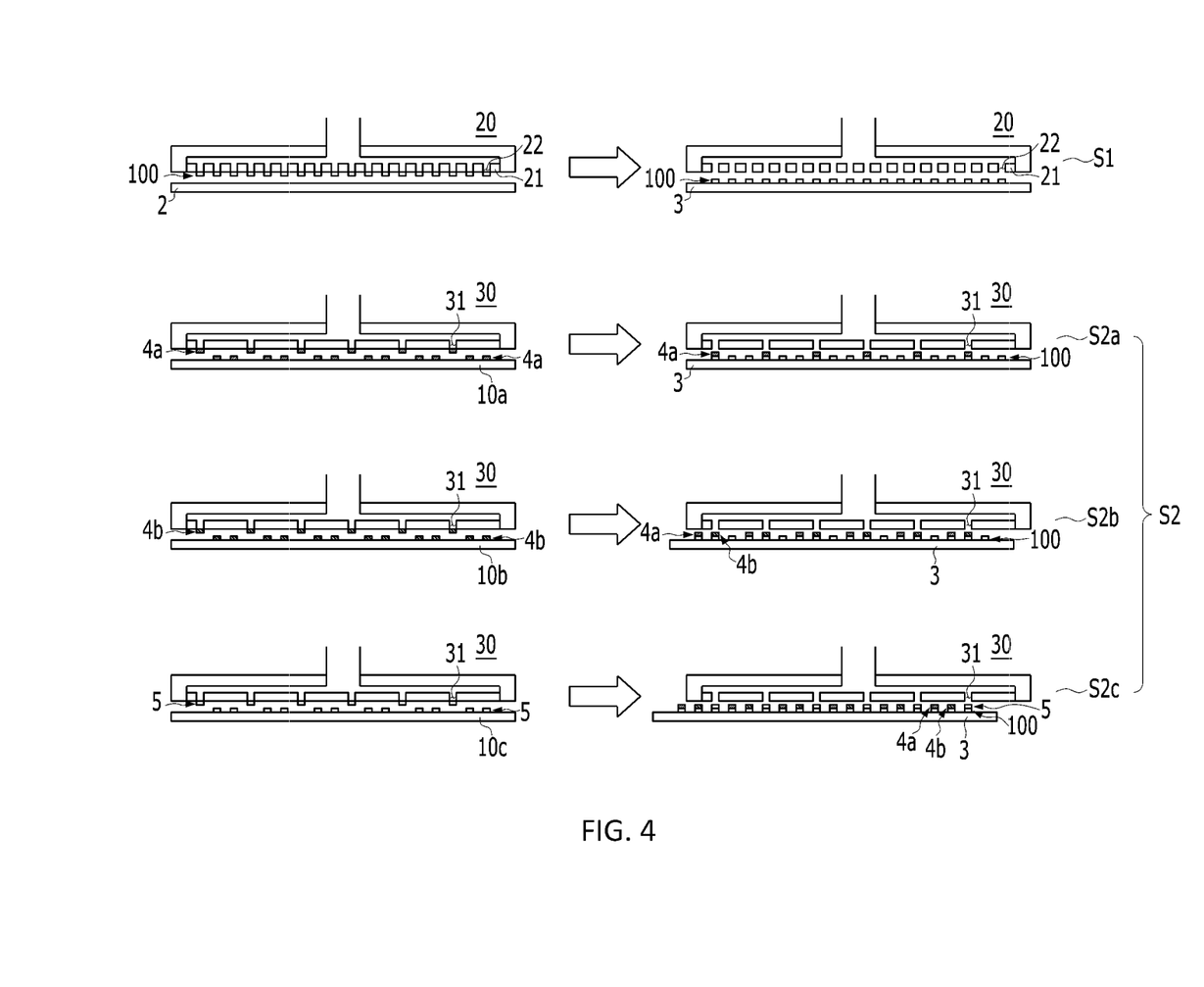

FIG. 4 is a view sequentially illustrating a method of manufacturing the micro LED structure 1 according to the first embodiment of the present invention. As illustrated in FIG. 4, the method of manufacturing the micro LED structure 1 according to the first embodiment includes: a first step S1 in which a first transfer head 20 grips the micro LEDs 100 fabricated on a first substrate 2 and transfers the micro LEDs 100 to the second substrate 3; and a second step S2 in which a second transfer head 30 transfers strip-shaped color conversion films onto the micro LEDs 100 transferred to the second substrate 3 to realize pixel geometry on the second substrate 3.

The first transfer head 20, which is provided to grip the micro LEDs 100 fabricated on the first substrate (e.g., the growth substrate 101 illustrated in FIG. 1), grips the micro LEDs 100 of the first substrate 2. The first transfer head 20 performs the first step S1 by transferring the micro LEDs 100 gripped from the first substrate 2 to the second substrate 3. The first transfer head 20 here functions to grip the micro LEDs 100 of the first substrate 2 and transfer the micro LEDs 100 to the second substrate 3. The first transfer head 20 may use an electrostatic force, a vacuum suction force, a magnetic force, a van der Waals force, or the like to grip the micro LEDs 100. In the following description, the first transfer head 20 grips the micro LEDs 100 using the vacuum suction force for the sake of easy explanation.

The first transfer head 20 performing the first step S1 grips the micro LEDs 100 using the vacuum suction force. Accordingly, the first transfer head 20 may be provided with grip portions. The grip portions may be embodied by multiple vacuum suction holes 22 through which the vacuum pressure for gripping the micro LEDs 100 is generated. In addition, the grip portions are configured to have the same pitch distances as the pitch distances of the micro LEDs 100 of the first substrate 2 in the longitudinal and transverse directions, thereby gripping the micro LEDs 100 of the first substrate 2 in a batch manner.

The first transfer head 20 transfers the micro LEDs 100 of the first substrate 2 gripped by the grip portions to the second substrate 3.

The second transfer head 30 transferring the color conversion films 4 is positioned over film substrates 10 on which the color conversion films 4 are provided. The second transfer head 30 transfers the color conversion films 4 onto the micro LEDs 100 using the same suction force as do the first transfer head 20. In the following description, the second transfer head 30 transfers the color conversion films 4 onto the micro LEDs 100 using the vacuum suction force as an example. Since the color conversion films 4 includes the first color conversion films 4a converting blue light into red light and the second color conversion films 4b converting blue light into green light, the film substrates 10 may include a first film substrate 10a on which the first color conversion films 4a are provided and a second film substrate 10b on which the second color conversion films 4b are provided.

The second transfer head 30 may be provided with grip portions embodied by multiple vacuum suction holes 31 through which a vacuum pressure gripping the color conversion films 4 is generated. The second transfer head 30 may transfer any one kind of the first and second color conversion films 4a and 4b onto the micro LEDs 100 first. In other words, the order of transferring the color conversion films of the first and second color conversion films 4a and 4b onto the micro LEDs 100 is not limited to the following description. In the following description, the first color conversion films 4a are transferred onto the micro LEDs 100 first.

The strip-shaped color conversion films 4 including the first and second color conversion films 4a and 4b may be transferred at a pitch distance in at least one direction three times the pitch distance in the one or more directions of the micro LEDs 100 transferred to the second substrate 3. Accordingly, the grip portions of the second transfer head 30 may be configured to have a pitch distance in at least one direction three times the pitch distance in the one or more directions of the micro LEDs 100 transferred to the second substrate 3. In the present invention, in the following description, the grip portions of the second transfer head 30 are configured to have a pitch distance in the transverse direction three times the pitch distance in the transverse direction of the micro LEDs 100 transferred to the second substrate 3.

The second transfer head 30, which has the grip portions having a pitch distance in the transverse direction three times the pitch distance in the transverse direction of the micro LEDs 100 transferred to the second substrate 3, is positioned over the first film substrate 10a to grip the first color conversion films 4a. As illustrated in S2a of FIG. 4, the second transfer head 30 may selectively grip the first color conversion films 4a from the first film substrate 10a. The second transfer head 30 gripping the first color conversion films 4a is positioned over the second substrate 3. The second transfer head 30 positioned over the second substrate 3 transfers the gripped first color conversion films 4a onto the micro LEDs 100 of the second substrate 3. Due to the grip portions of the second transfer head 30, the first color conversion films 4a are transferred at a pitch distance in the transverse direction three times the pitch distance in the transverse direction of the micro LEDs 100 with respect to the micro LEDs 100 of the first column of the second substrate, starting from the first column.

Then, the second transfer head 30 is positioned over the second film substrate 10b to grip the second color conversion films 4b. As illustrated in S2b of FIG. 4, the second transfer head 30 may selectively grip the second color conversion films 4b from the second film substrate 10b. The second transfer head 30 is positioned over the second substrate 3 while gripping the second color conversion films 4b and transfers the second color conversion films 4b onto the micro LEDs 100 of the second substrate 3. In this case, the second color conversion films 4b are transferred at a pitch distance in the transverse direction three times the pitch distance in the transverse direction of the micro LEDs 100 while being spaced apart from the first color conversion films 4a. As illustrated in S2b of FIG. 4, the second transfer head 30 moves to the right in the drawing by the pitch distance in the transverse direction of the micro LEDs 100 of the second substrate 3 and transfers the second color conversion films 4b onto the micro LEDs 100 in a batch manner.

As described above, after performing the second step S2 in which the second transfer head 30 transfers the strip-shaped color conversion films 4 onto the micro LEDs 100 transferred to the second substrate 3 to realize pixel geometry on the second substrate 3, a third step is performed in which the transparent films 5 are transferred between the first and second color conversion films 4a and 4b. As illustrated in S2c of FIG. 4, the transparent films 5 are gripped by the second transfer head 30 and transferred onto the micro LEDs 100 transferred to the second substrate 3. The transparent films 5 are transferred between the first and second color conversion films 4a and 4b transferred onto the micro LEDs 100 of the second substrate 3 by the arrangement of the grip portions of the second transfer head 30. Referring to S2b and S2c of FIG. 4, the second transfer head 30 moves to the right in the drawing by the pitch distance in the transverse direction of the micro LEDs 100 of the second substrate 3 from the position at which the second color conversion films 4b are transferred at S2b and then transfers the transparent films 5 onto the micro LEDs 100 in a batch manner. The transparent films 5 are transferred onto the micro LEDs 100 such that the transparent films 5 are disposed between the first and second color conversion films 4a and 4b. Since the transparent films 5 absorb and transmit light of the micro LEDs 100 as it is, the transparent films 5 may not be provided onto the micro LEDs 100. In other words, after performing the second step S2, the third step in which the transparent films 5 are transferred may be omitted. The third step is illustrated in S2c of FIG. 4. Although the third step in which the transparent films 5 are transferred may be selectively performed, the present invention has been described that the transparent films 5 are transferred as an example. Thus, the third step in which the transparent films 5 are transferred is included in the second step S2 in the drawing.

After performing the second step S2 in which the second transfer head 30 transfers the strip-shaped color conversion films 4 to realize pixel geometry on the second substrate 3, a fourth step may be selectively performed in which the color filters are transferred onto the color conversion films 4. The fourth step in which the color filters are transferred onto the color conversion films 4 is performed after any color conversion films of the first and second color conversion films 4a and 4b are transferred onto the micro LEDs 100. For example, after the first color conversion films 4a are transferred, the color filters may be transferred only onto the first color conversion films 4a. Alternatively, after the first and second color conversion films 4a and 4b are transferred, the color filters are transferred onto the first and second color conversion films 4a and 4b at the same time. Alternatively, when performing the third step in which the transparent films 5 are transferred onto the micro LEDs 100, the color filters may be transferred onto the first color conversion films and the transparent films 5 at the same time after the third step.

The color filters may be transferred using the second transfer head 30 gripping the color conversion films 4 or using a third transfer head gripping only the color filters. However, in the case using the second transfer head 30 to transfer the color filters, the color filters are transferred only according to the arrangement of the grip portions of the second transfer head 30. Thus, the order of performing the fourth step in which the color filters are transferred is limited. In other words, in a case where the grip portions of the second transfer head 30 are configured to have a pitch distance in the transverse direction three times the pitch distance in the transverse direction of the micro LEDs 100 of the second substrate 3, the color filters are transferred only at a pitch distance in the transverse direction three times the pitch distance in the transverse direction of the micro LEDs 100. Therefore, the fourth step in which the color filters are transferred is performed in a limited order, such as after any color conversion films of the color conversion films 4 are transferred, and after the transparent films 5 are transferred.

The micro LED structure 1 of the first embodiment can be manufactured in a simple process by using the first transfer head 20 gripping and transferring the micro LEDs 100 and by using the second transfer head 30 gripping and transferring the strip-shaped color conversion films 4. For example, after the first transfer head 20 transfers the micro LEDs 100 to the second substrate 3, the second transfer head 30 is positioned over the second substrate 3 to transfer the color conversion films 4 onto the micro LEDs 100. This is not an additional process for transferring the color conversion films 4, but rather a process performed by moving the first and second transfer head 20 and 30 to be positioned over the second substrate 3, and thus the process can be simply performed compared with imprinting, roll lamination, or ink jetting.

At the second step S2 where the second transfer head 30 transfers the strip-shaped color conversion films 4 onto the micro LEDs 100 transferred to the second substrate 3 to realize pixel geometry one the second substrate 3, instead of transferring the strip-shaped color conversion films 4, the color conversion films 4 formed by being cut into the lattice form are transferred onto the micro LEDs 100 transferred to the second substrate 3 to realize pixel geometry onto the second substrate 3.

In the case of transferring the color conversion films 4 formed by being cut into the lattice form onto the micro LEDs 100 transferred to the second substrate 3, the second step S2 in which the color conversion films 4 are transferred may be performed using the first transfer head 20 used at the first step S1. In other words, the first step S1 in which the micro LEDs 100 are gripped and transferred to the second substrate 3 and the second step S2 in which the color conversion films 4 are transferred onto the micro LEDs 100 transferred to the second substrate 3 can be performed using the single first transfer head 20. When the color conversion films 4 formed by being cut into the lattice form are transferred onto the micro LEDs 100 using the first transfer head 20, the color conversion films 4 formed by being cut into the lattice form may be transferred according to the arrangement of the grip portions of the first transfer head 20. In addition, the first transfer head 20 transfers the transparent films 5 formed by being cut into the lattice form onto the micro LEDs 100. The transparent films 5 may be selectively transferred. In the following description, the first transfer head 20 transfers the color conversion films 4 and the transparent films 5. A process of transferring the color conversion films 4 and the transparent films 5 which are formed by being cut into the lattice form will be described in detail with reference to FIGS. 5A to 5D.

FIGS. 5A to 5D are views schematically illustrating a method of manufacturing the micro LED structure 1 according to the second embodiment of the present invention.

As same as the first step S1, which is illustrated in S1 of FIG. 4, of the method of manufacturing the micro LED structure 1 according to the first embodiment, the first transfer head 20 transfers the micro LEDs 100 fabricated on the first substrate 2 and transfers the micro LEDs 100 to the second substrate 3. In this case, the first transfer head 20 reciprocates between the first substrate 2 and the second substrate 3 multiple times and transfers the micro LEDs 100 to the second substrate 3 according to the arrangement of the grip portions. The arrangement of the grip portions that may be provided in the first transfer head 20 will be described with reference to FIGS. 5B and 5C. However, the arrangement of the grip portions of the first transfer head 20 is not limited thereto.

Figure 5A:
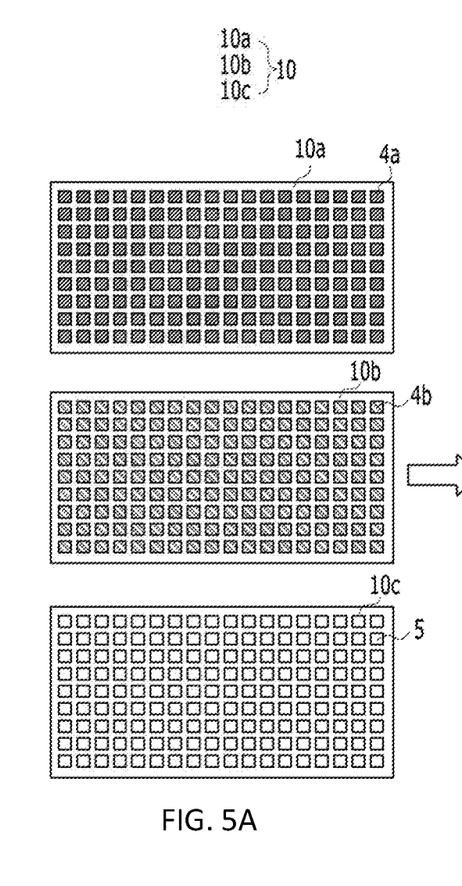
Figure 5B:
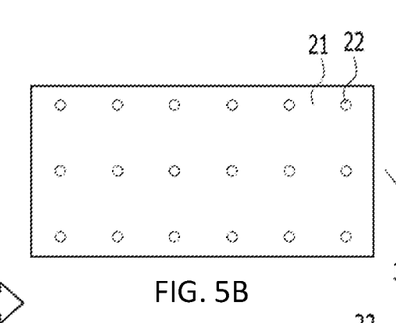
Figure 5C:
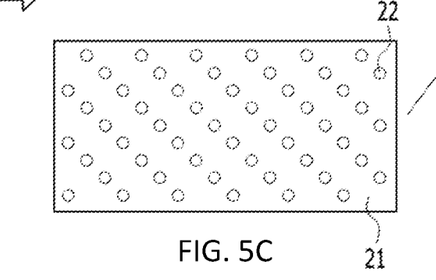
Figure 5D:
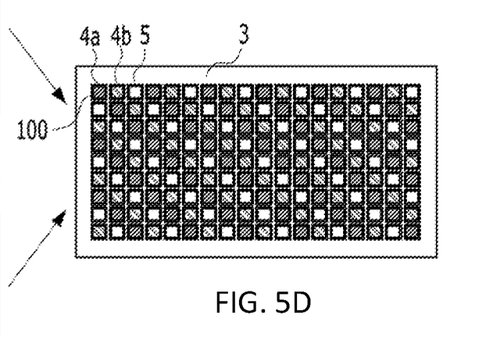

FIGS. 5B and 5C are bottom views each illustrating a grip member 21 on which the grip portions of the first transfer head 20 are formed. As illustrated in FIG. 5B, the first transfer head 20 has the grip portions configured at a pitch distance in the longitudinal direction three times the pitch distance in the longitudinal direction of the micro LEDs 100 fabricated on the first substrate 2 and a pitch distance in the transverse direction three times the pitch distance in the transverse direction of the micro LEDs 100 fabricated on the first substrate 2. The micro LEDs 100 may be disposed on the first substrate 2 at the same pitch distance as the pitch distance of the first and second color conversion films 4a and 4b and the transparent films 5 respectively disposed on the first to third film substrates 10a, 10b, and 10c illustrated in FIG. 5A.

With this arrangement of the grip portions, the first transfer head 20 selectively grips the micro LEDs 100 of the first substrate 2 and transfers the micro LEDs 100 to the second substrate 3. The first transfer head 20 transfers all of the micro LEDs 100 fabricated on the first substrate 2 to the second substrate 3 by reciprocating nine times between the first substrate 2 and the second substrate 3. Then, the first transfer head 20 reciprocates between the first to third film substrates 10a, 10b, and 10c and the second substrate 3 nine times to transfer the color conversion films 4 formed by being cut into the lattice form onto the micro LEDs 100 of the second substrate 3 and thus realizes pixels of 1×3 arrangement.

Referring to FIG. 5A, the first color conversion films 4a are disposed on the first film substrate 10a at regular distances in the longitudinal and transverse directions, and the second color conversion films 4b are disposed on the second film substrate 10b at regular distances in the longitudinal and transverse directions. In addition, the transparent films 5 are disposed on the third film substrate 10c at regular distances in the longitudinal and transverse directions. In addition, the first and second color conversion films 4a and 4b and the transparent films 5 are disposed on the first to third film substrates 10a, 10b, and 10c, respectively, at the same pitch distance in the longitudinal direction and at the same pitch distance in the transverse direction.

The first transfer head 20 transfers all of the micro LEDs 100 of the first substrate 2 to the second substrate 3 by reciprocating nine times between the first substrate 2 and the second substrate 3. Then, the first transfer head 20 selectively grips the first color conversion films 4a from the first film substrate 10a and transfers the first color conversion films 4a onto the micro LEDs 100 of the second substrate 3 in a batch manner. The above process may be performed at the first transfer. In the second transfer, the first transfer head 20 selectively grips the second color conversion films 4b from the second film substrate 10b. Then, the first transfer head 20 is moved to the right side of the drawing by the pitch distance in the transverse direction of the micro LEDs 100 of the second substrate 3 with respect to the first color conversion films 4a already transferred onto the micro LEDs 100 of the second substrate 3 and transfers the second color conversion films 4b onto the micro LEDs 100 of the second substrate 3 in a batch manner. In the third transfer, the first transfer head 20 selectively grips the transparent films 5 from the third film substrate 10c. Then, the first transfer head 20 is moved to the right side of the drawing by the pitch distance in the transverse direction of the micro LEDs 100 of the second substrate 3 with respect to the second color conversion films 4b already transferred onto the micro LEDs 100 of the second substrate 3 and transfers the transparent films 5 onto the micro LEDs 100 of the second substrate 3 in a batch manner.

In the fourth transfer, the first transfer head 20 selectively grips the first color conversion films 4a from the first film substrate 10a. Then, the first transfer head 20 is moved downward in the drawing by the pitch distance in the longitudinal direction of the micro LEDs 100 of the second substrate 3 with respect to the second color conversion films 4b already transferred to the second substrate 3 and transfers the first color conversion films 4a onto the micro LEDs 100 of the second substrate 3 in a batch manner. In the fifth transfer, the first transfer head 20 selectively grips the second color conversion films 4b from the second film substrate 10b. Then, the first transfer head 20 is moved to the right side of the drawing by the pitch distance in transverse direction of the micro LEDs 100 of the second substrate 3 with respect to the first color conversion films 4a transferred to second substrate 3 in the fourth transfer and transfers the second color conversion films 4b onto the micro LEDs 100 of the second substrate 3 in a batch manner. In the sixth transfer, the first transfer head 20 selectively grips the transparent films 5 from the third film substrate 10c. Then, the first transfer head 20 is moved to the right side of the drawing by the pitch distance in the transverse direction of the micro LEDs 100 of the second substrate 3 with respect to the second color conversion films 4b transferred to the second substrate 3 in the fifth transfer and transfers the transparent films 5 onto the micro LEDs 100 of the second substrate 3 in a batch manner.

In the seventh transfer, the first transfer head 20 selectively grips the first color conversion films 4a from the first film substrate 10a. Then, the first transfer head 20 is moved downward in the drawing by the pitch distance in the longitudinal direction of the micro LEDs 100 of the second substrate 3 with respect to the transparent films 5 already transferred to the second substrate 3 and transfers the first color conversion films 4a onto the micro LEDs 100 of the second substrate 3 in a batch manner. In the eighth transfer, the first transfer head 20 selectively grips the second color conversion films 4b from the second film substrate 10b.

Then, the first transfer head 20 is moved to the right side of the drawing by the pitch distance in transverse direction of the micro LEDs 100 of the second substrate 3 with respect to the first color conversion films 4a transferred to second substrate in the seventh transfer and transfers the second color conversion films 4b onto the micro LEDs 100 of the second substrate 3 in a batch manner. In the ninth transfer, the first transfer head 20 selectively grips the transparent films 5 from the third film substrate 10c. Then, the first transfer head 20 is moved to the right side of the drawing by the pitch distance in the transverse direction of the micro LEDs 100 of the second substrate 3 with respect to the second color conversion films 4b transferred to the second substrate 3 in the eighth transfer and transfers the transparent films 5 onto the micro LEDs 100 of the second substrate 3 in a batch manner.

Through the nine times of the reciprocation transfer process of the first transfer head 20 as described above, the color conversion films 4 can be transferred in the lattice form onto the micro LEDs 100 of the second substrate 3. In addition, the transparent films 5 may be transferred in the lattice form.

Before the color conversion films 4 formed by being cut into the lattice form are transferred onto the micro LEDs 100 transferred to the second substrate 3, the transparent films 5 are transferred, and pixels of 1×3 arrangement are implemented as described above, in a case of using the first transfer head 20 having the grip portions configured at a pitch distance in the longitudinal direction three times the pitch distance in the longitudinal direction of the micro LEDs 100 fabricated on the first substrate 2 and configured at a pitch distance in transverse direction three times the pitch distance in the transverse direction of micro LEDs 100 fabricated on the first substrate 2 to transfer the micro LEDs 100 fabricated on the first substrate 2 to the second substrate 3, the first transfer head 20 performs transfer by reciprocating between the first substrate 2 and the second substrate 3 nine times as the first transfer head 20 reciprocates between the first to third film substrates 10a, 10b, and 10c and the second substrate 3 nine times.

As illustrated in FIG. 5C, the first transfer head 20 may be configured with the grip portions in which the vacuum suction holes 22 are arranged at a regular distance in the diagonal direction. A diagonal separation distance of the vacuum suction holes 22 is the same as a diagonal pitch distance of the first and second color conversion films 4a and 4b and the transparent films 5 disposed on the first to third film substrates 10a, 10b, and 10c. The first substrate 2 has the micro LEDs 100 at the regular distances in the longitudinal and transverse directions so that the regular distances thereof may be the same as the separation distances of the first and second color conversion films 4a and 4b and the transparent films 5 of the first to third film substrates 10a, 10b, and 10c. Therefore, the diagonal separation distance of the vacuum suction holes 22 may be the same distance as the diagonal pitch distance of the micro LEDs 100 of the first substrate 2.

With this arrangement of the grip portions, the first transfer head 20 selectively grips the micro LEDs 100 of the first substrate 2 and transfers the micro LEDs 100 to the second substrate 3 in a batch manner. The micro LEDs 100 are disposed on the first substrate 2 at regular distances in the longitudinal and transverse directions. The first transfer head 20 transfers the micro LEDs 100 of the first substrate 2 to the second substrate 3 by reciprocating three times between the first substrate 2 and the second substrate 3.

In addition, the first transfer head 20 reciprocates between the first to third film substrates 10a, 10b, and 10c and the second substrate 3 three times to transfer the first and second color conversion films 4a and 4b and the transparent films 5 onto the micro LEDs 100 transferred to the second substrate 3 and thus realizes pixels of 1×3 arrangement.

Referring to FIGS. 5A to 5D, the first color conversion films 4a are disposed on the first film substrate 10a at regular distances in the longitudinal and transverse directions, and the second color conversion films 4b are disposed on the second film substrate 10b at regular distances in the longitudinal and transverse directions. In addition, the transparent films 5 are disposed the third film substrate 10c at regular distances in the longitudinal and transverse directions. In addition, the first and second color conversion films 4a and 4b and the transparent films 5 are disposed on the first to third film substrates 10a, 10b, and 10c, respectively, at the same pitch distance in the longitudinal direction and at the same pitch distance in the transverse direction.

The first transfer head 20 selectively grips the first color conversion films 4a from the first film substrate 10a and transfers the first color conversion films 4a onto the micro LEDs 100 of the second substrate 3. The above process is performed at the first transfer. In the second transfer, the first transfer head 20 selectively grips the second color conversion films 4b from the second film substrate 10b. Then, the first transfer head 20 is moved to the right side of the drawing by the pitch distance in the transverse direction of the micro LEDs 100 of the second substrate 3 with respect to the first color conversion films 4a already transferred onto the micro LEDs 100 of the second substrate 3 and transfers the second color conversion films 4b onto the micro LEDs 100 of the second substrate 3 in a batch manner. In the third transfer, the first transfer head 20 selectively grips the transparent films 5 from the third film substrate 10c. Then, the first transfer head 20 is moved to the right side of the drawing by the pitch distance in the transverse direction of the micro LEDs 100 of the second substrate 3 with respect to the second color conversion films 4b already transferred onto the micro LEDs 100 of the second substrate 3 and transfers the transparent films 5 onto the micro LEDs 100 of the second substrate 3 in a batch manner.

Before the color conversion films 4 formed by being cut into the lattice form are transferred onto the micro LEDs 100 transferred to the second substrate 3 and pixels of 1×3 arrangement are implemented as described above, in a case of using the first transfer head 20 having the grip portions configured at a diagonal pitch distance same as the diagonal pitch distance of the micro LEDs 100 fabricated on the first substrate 2 or same as the diagonal pitch distance of the first and second color conversion films 4a and 4b and the transparent films 5 disposed on the first to third film substrates 10a, 10b, and 10c, the first transfer head 20 transfers the micro LEDs 100 of the first substrate 2 to the second substrate 3 by reciprocating between the first substrate 2 and the second substrate 3 three times as the first transfer head 20 reciprocates between the first to third film substrates 10a, 10b, and 10c and the second substrate 3 three times. Here, the pitch distances in the longitudinal and transverse directions of the micro LEDs 100 of the first substrate 2 may be the same as the pitch distances in the longitudinal and transverse directions of the first and second color conversion films 4a and 4b and the transparent films 5 disposed on the first to third film substrates 10a, 10b, and 10c. Thus, the diagonal pitch distance of the micro LEDs 100 fabricated on the first substrate 2 may be the same as the diagonal pitch distance of the first and second color conversion films 4a and 4b and the transparent films 5 disposed on the first to third film substrates 10a, 10b, and 10c.

As described above, the first transfer head 20 selectively grips the color conversion films 4 formed by being cut into the lattice form and reciprocates multiple times, thereby transferring the color conversion films 4 to the second substrate 3 according to the arrangements of the grip portions illustrated in FIGS. 5B and 5C.

In the case of transferring the color conversion films 4 formed by being cut into the lattice form onto the micro LEDs 100 to realize pixel geometry, the process of transferring the micro LEDs 100 to the second substrate 3 and the process of transferring the color conversion films 4 onto the transferred micro LEDs 100 can be performed with one transfer head, thereby improving the efficiency of the process. In a case of proving a phosphor layer on the micro LEDs 100 by performing imprinting, a roll lamination, or an ink jetting, the efficiency of the process is reduced because a means for each process is required to be separately provided and performed in a separate process. However, according to the present invention, in the case of realizing pixel geometry with the color conversion films 4 formed by being cut into the lattice form, one transfer head is used to perform a process for realizing pixel geometry, thereby improving the efficiency of the process.

As the micro LED structure 1 according to the first embodiment, the micro LED structure 1 according to the second embodiment provided with the color conversion films 4 formed by being cut into a lattice form may be manufactured by performing the first step S1 performed by the first transfer head 20 gripping the micro LEDs 100 and the second step S2 performed by the second transfer head 30 transferring the color conversion films 4.

The first transfer head 20 grips all of the micro LEDs 100 of the first substrate 2 and transfers the micro LEDs 100 to the second substrate 3. In this case, the micro LEDs 100 of the first substrate 2 have regular pitch distances in the longitudinal and transverse directions, and the first transfer head 20 gripping the micro LEDs 100 of the first substrate 2 has the grip portions configured at the same pitch distances in the longitudinal and transverse directions as the pitch distance in the longitudinal and transverse directions of the micro LEDs 100 of the first substrate 2. Accordingly, the first transfer head 20 grips all of the micro LEDs 100 of the first substrate 2 and transfers the micro LEDs 100 to the second substrate 3.

Then, the second transfer head 30 transferring the color conversion films 4 is positioned over the film substrates 10 on which the color conversion films 4 are provided. As illustrated in FIG. 5B, the second transfer head 30 may have the grip portions configured at a pitch distance in the longitudinal direction three times the pitch distance in the longitudinal direction of the micro LEDs 100 fabricated on the first substrate 2 and a pitch distance in the transverse direction three times the pitch distance in the transverse direction of the micro LEDs 100 fabricated on the first substrate 2. In the case where the second transfer head 30 is provided with the grip portions having the above arrangement, the second transfer head 30 reciprocates between the first to third film substrates 10a, 10b, and 10c and the second substrate 3 nine times to transfer the color conversion films 4 formed by being cut into the lattice form onto the micro LEDs 100 of the second substrate 3 and thus realizes pixels of 1×3 arrangement.

Alternatively, as illustrated in FIG. 5C, the second transfer head 30 may be configured with the grip portions in which the vacuum suction holes 22 are arranged at a regular distance in the diagonal direction. In the case where the second transfer head 30 is provided with the grip portions having the above arrangement, the second transfer head 30 reciprocates between the first to third film substrates 10a, 10b, and 10c and the second substrate 3 three times to transfer the color conversion films 4 formed by being cut into the lattice form onto the micro LEDs 100 of the second substrate 3 and thus realizes pixels of 1×3 arrangement.

In the case of transferring the color conversion films 4 formed by being cut into the lattice form onto the micro LEDs 100 to realize pixel geometry, although the efficiency of the process can be improved by using only one transfer head, it is also possible that the transfer head gripping and transferring the micro LEDs 100 and the transfer head transferring the color conversion films 4 are used separately to perform the process so that pixel geometry is realized, and the efficiency of the process is improved. In the case of using the transfer head transferring the micro LEDs 100 and the transfer head transferring the color conversion films 4 separately to perform the process, each transfer head is moved in one process to perform the process rather than performing a separate process such as imprinting, roll lamination, or ink jetting, thereby easily performing the process. In addition, since the first transfer head 20 grips the micro LEDs 100 of the first substrate 2 in a batch manner and transfers the micro LEDs 100 to the second substrate 3, the first transfer head 20 can complete the transfer of the micro LEDs 100 only by reciprocating once between the first substrate 2 and the second substrate 3. As a result, the process of transferring the micro LEDs 100 to the second substrate 3 can be performed quickly, and the time for the second transfer head 20 to start the process of transferring the color conversion films 4 can be shortened, thereby improving the efficiency of the process.

The micro LED structure 1 of the present invention may be manufactured by transferring a color conversion film 4 onto the micro LEDs 100 of the second substrate 3 at the same time. In this case, the color conversion film 4 may include: transparent films 5; first color conversion layers 6 provided on the transparent films 5 and converting a first light into a second light; and second color conversion layers 7 converting the first light into a third light. The first light here may mean blue light, the second light may mean red light, and the third light may mean green light.

In a case where the first and second color conversion layers 6 and 7 are provided on the transparent films 5, the transparent films 5 preferably be provided in the form of a substrate having a flat cross section. FIG. 6A to FIG. 7B illustrate that the transparent films 5 have a rectangular cross section as an example. In this case, the shape of the transparent films 5 is not limited thereto. The transparent films 5 may be provided in a shape having a cross section suitable for providing the first and second color conversion layers 6 and 7 thereon.

The following description will be described in detail with reference to FIG. 6A to FIG. 7B.

FIG. 6A to FIG. 7B are views illustrating arrangements of the first color conversion layers 6 and the second color conversion layers 7 provided on the transparent films 5.

Figure 6A:
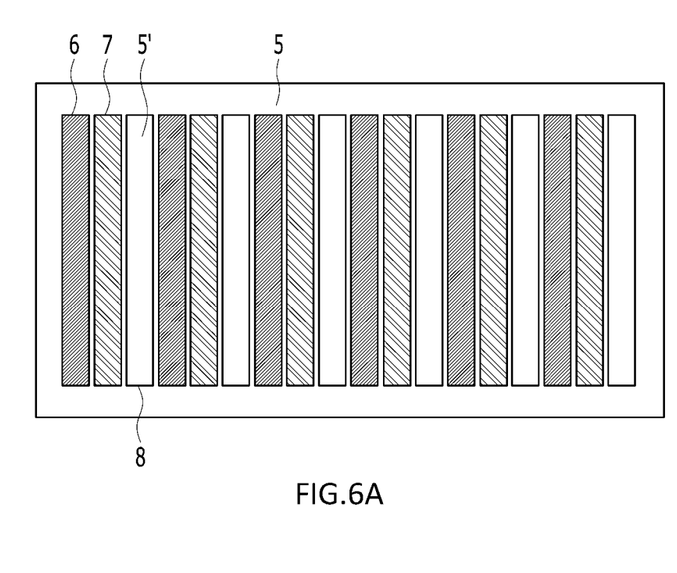

The color conversion film 4 of the present invention may include: the transparent films 5; the first color conversion layers 6 provided on the transparent films 5 and converting the first light into the second light; and the second color conversion layers 7 converting the first light into the third light.

The color conversion film 4 having the above configuration may be configured with an arrangement in which the first color conversion layers 6 and the second color conversion layers 7 are provided on the transparent films 5 before being transferred on the micro LEDs 100 transferred to the second substrate 3. Then, the color conversion film 4 including the transparent films 5, the first color conversion layers 6, and the second color conversion layers 7 is gripped at a time and transferred to the micro LEDs 100 of the second substrate 3.

The first and second color conversion layers 6 and 7 arranged on the transparent films 5 may be formed by laminating on the transparent films 5 or attached to the transparent films 5 in the form of a film.

In the present invention, the first and second color conversion layers 6 and 7 are provided on the transparent films 5 in the form of a film as an example.

As illustrated in FIG. 6A, the first and second color conversion layers 6 and 7 may be provided on the transparent films 5 with an arrangement.

As illustrated in FIG. 6A, the respective first and second color conversion layers 6 and 7 are transferred at a pitch distance in the transverse direction three times the pitch distance in the transverse direction of the micro LEDs 100 of the second substrate in a manner extending in the longitudinal direction of the micro LEDs 100 in the strip shape.

When the leftmost column in FIG. 6A is called the first column, at least one of the first color conversion layers 6 and the second color conversion layers 7 is provided on the first column. In the present invention, the first color conversion layers 6 is provided on the first column.

The first color conversion layers 6 are provided at a pitch distance in the transverse direction three times the pitch distance in the transverse direction of the micro LEDs 100 of the second substrate 3 with respect to the first column. In this case, the first color conversion layers 6 may be provided in the extended form along the longitudinal direction of the micro LEDs 100. The first color conversion layers 6 are implemented in the strip shape along the longitudinal direction of the micro LEDs 100 due to the extended form thereof.

The second color conversion layers 7 may be provided on the second column which is the right of the first column on which the first color conversion layers 6 are provided. Since the first color conversion layers 6 are provided at the pitch distance in the transverse direction three times the pitch distance in the transverse direction of the micro LEDs 100, the second color conversion layers 7 may be provided in free space portions 8 defined between the first color conversion layers 6. In this case, the second color conversion layers 7 provided from on the second column are provided at a pitch distance in the transverse direction three times the pitch distance in the transverse direction of the micro LEDs 100.

Due to the first and second color conversion layers provided on the transparent films 5 at the pitch distance in the transverse direction three times the pitch distance in the transverse direction of the micro LEDs 100 of the second substrate 3, the free space portions 8 where no first and second color conversion layers 6 and 7 are provided may be provided on the transparent films 5.

The free space portions 8 may be selectively provided with strip-shaped transparent films 5'. In the present invention, as illustrated in FIG. 6A, the strip-shaped transparent films 5' are provided in the free space portions 8 as an example so that the first and second color conversion layers 6 and 7 and the strip-shaped transparent films 5' are arranged on the transparent films 5 in order.

The color conversion film 4 having the arrangement may be transferred onto the micro LEDs 100 of the second transfer head in a batch manner by the second transfer head 30 transferring the color conversion film 4 onto the micro LEDs 100 or the third transfer head gripping the color conversion film 4 in a batch manner having the arrangement defined by the first and second color conversion layers 6 and 7.

Figure 6B:
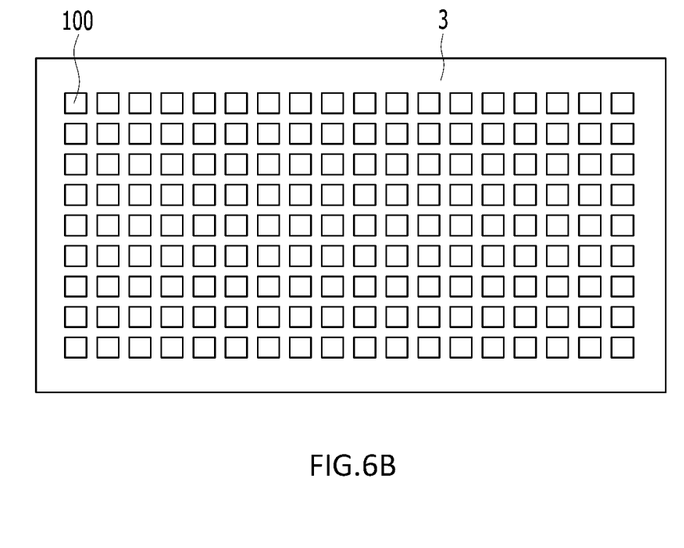

As illustrated in FIG. 6B, the second substrate 3 may be provided with the micro LEDs 100 at the same pitch distances in the longitudinal and transverse directions. As the color conversion film 4 illustrated in FIG. 6A is transferred onto the micro LEDs 100 at a time, multiple pixels constituted by the first and second color conversion layers 6 and 7 are formed on the second substrate 3. In this case, a form is implemented in which one color conversion layer transferred on one column of the micro LEDs 100 of the second substrate 3 emits one color of light.

Figure 7A:
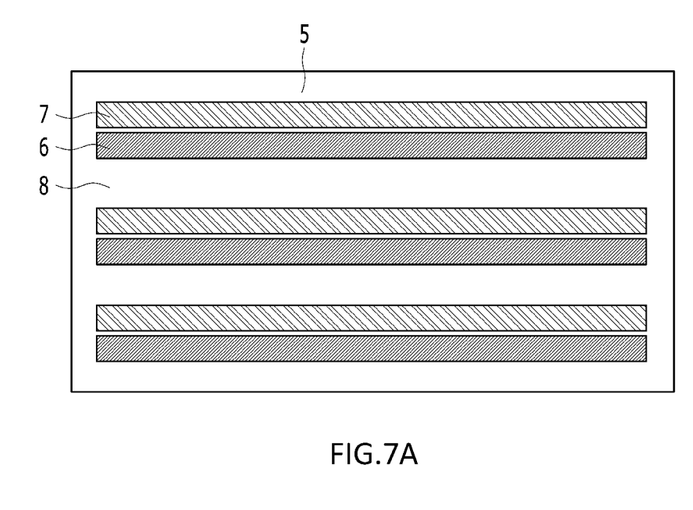
Figure 7B:
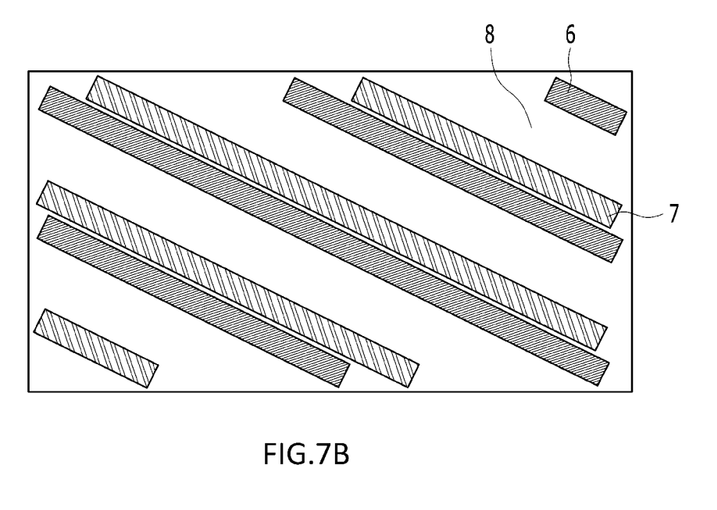

FIGS. 7A and 7B are views each illustrating that first color conversion layers 6 and second color conversion layers 7 are provided on the transparent films 5 with a different arrangement of FIG. 6A. FIGS. 7A and 7B illustrate that strip-shaped transparent films 5' are not provided in the free space portions 8, and only the first and second color conversion layers 6 and 7 are arranged on the transparent films 5. In this case, the strip-shaped transparent films 5' may be provided on the free space portions 8.

FIG. 7A is a view illustrating that the respective first and second color conversion layers 6 and 7 are arranged on the transparent films 5 at a pitch distance in the longitudinal direction three times the pitch distance in the longitudinal direction of the micro LEDs 100 of the second substrate 3 in a manner extending in the transverse direction of the micro LEDs 100 in the strip shape.

The first and second color conversion layers 6 and 7 may be provided in the extended form along the transverse direction of the micro LEDs 100. In a case where the color conversion film 4 is transferred onto the micro LEDs 100 of the second substrate 3 at a time, a form is implemented in which one color conversion layer transferred on one row of the micro LEDs 100 of the second substrate 3 emits one color of light.

As described above, the first and second color conversion layers 6 and 7 may be provided on the transparent films 5 at a pitch distance in at least one direction three times the pitch distance in the one or more directions of the micro LEDs 100 of the second substrate 3 and then transferred onto the micro LEDs 100 at a time.

Alternatively, as illustrated in FIG. 7B, the first and second color conversion layers 6 and 7 may be provided on the transparent films 5 at a diagonal pitch distance three times the diagonal pitch distance of the micro LEDs 100 of the second substrate 3. In a case where the color conversion film 4 having the above arrangement is transferred onto the micro LEDs 100 of the second substrate 3, a form is implemented in which one color conversion layer transferred in the diagonal direction of the micro LEDs 100 of the second substrate 3 emits one color of light.

Although FIG. 6A to FIG. 7B illustrate that the first and second color conversion layers 6 and 7 are provided in the strip shape, the first and second color conversion layers 6 and 7 may be provided in a lattice form. In this case, a transfer head provided to grip the first and second color conversion layers provided in the lattice form may selectively grip the respective first and second color conversion layers 6 and 7 according to the arrangement to be formed on the transparent films 5 and transfer the first and second color conversion layers 6 and 7 to the transparent films 5. Then, the transfer head grips the color conversion film 4 at a time and transfers the color conversion film 4 onto the micro LEDs 100 of the second substrate 3.

As illustrated in FIG. 6A to FIG. 7B, according to the present invention, the arrangement of the first and second color conversion layers 6 and 7 is formed on the transparent films 5 and then the color conversion film 4 is gripped at a time and transferred onto the micro LEDs 100 of the second substrate 3 at a time.

As a result, it is possible to effectively perform the process in terms of forming multiple pixels onto the micro LEDs 100 of the second substrate 3.

As described above, the present invention has been described with reference to the embodiments. However, those skilled in the art will appreciate that various modifications, additions and substitutions are possible, without departing from the scope and spirit of the invention as disclosed in the accompanying claims.

What is claimed is:

1. A micro LED structure, comprising:
   multiple micro LEDs transferred from a first substrate to a second substrate and separated from each other by a separation distance, wherein the micro LEDs emit a first light; and
   color conversion films including first color conversion films and second color conversion films, wherein a first horizontal width of each of the color conversion films is greater than a second horizontal width of each of the multiple micro LEDs,
   wherein the first color conversion films are transferred onto first micro LEDs among the multiple micro LEDs and convert the first light into a second light,
   wherein the second color conversion films are transferred onto second micro LEDs among the multiple micro LEDs and convert the first light into a third light,
   wherein the second color conversion films are spaced apart from the first color conversion films in a transverse direction,
   wherein the first color conversion films are transferred at a first pitch distance in the transverse direction three times a second pitch distance of the micro LEDs in the transverse direction, and
   wherein the second color conversion films are transferred at a third pitch distance in the transverse direction three times the second pitch distance of the micro LEDs in the transverse direction.

2. The micro LED structure of claim 1,
   wherein the first micro LEDs are arranged in a longitudinal direction, and the second micro LEDs are arranged in the longitudinal direction, and
   wherein the first color conversion films and the second color conversion films are transferred in a manner each extending in the longitudinal direction and having a strip shape.

3. The micro LED structure of claim 1,
   wherein the color conversion films are transferred in a lattice form, and
   wherein the color conversion films are disposed on the multiple micro LEDs at regular pitch distances in a longitudinal direction and the transverse direction of the multiple micro LEDs or in a diagonal direction of the multiple micro LEDs.

4. The micro LED structure of claim 1, further comprising:
   a transparent film transferred onto third micro LEDs among the multiple micro LEDs.

5. The micro LED structure of claim 1, wherein the multiple micro LEDs are blue micro LEDs, and the first light is blue light, the second light is red light, and the third light is green light.

6. The micro LED structure of claim 1, wherein the first and second color conversion films are formed by laminating on a transparent film or being attached to the transparent film in a film form.

7. The micro LED structure of claim 1, further comprising:
    a transparent film transferred between the first and second color conversion films.

\* \* \* \* \*